(12) United States Patent
Sandre (10) Patent No.: US 10,948,552 B2
(45) Date of Patent: Mar. 16, 2021

(54) MAGNETOMETER (71) Applicant: Robert Bosch GmbH, Stuttgart (DE)

(72) Inventor: Guido De Sandre, Brugherio (IT)

(73) Assignee: Robert Bosch GmbH, Stuttgart (DE)

( * ) Notice: Subject to any disclaimer, the term of this patent is extended or adjusted under 35 U.S.C. 154(b) by 65 days.

(21) Appl. No.: 16/476,330

(22) PCT Filed: Dec. 15, 2017

(86) PCT No.: PCT/EP2017/083098
§ 371 (c)(1),
(2) Date: Jul. 8, 2019

(87) PCT Pub. No.: WO2018/127387
PCT Pub. Date: Jul. 12, 2018

(65) Prior Publication Data
US 2019/0353716 A1 Nov. 21, 2019

(30) Foreign Application Priority Data

Jan. 9, 2017 (DE) .......................... 102017200143.7

(51) Int. Cl.
*G01R 33/00* (2006.01)
*G01R 33/02* (2006.01)
(Continued)

(52) U.S. Cl.
CPC ......... *G01R 33/0029* (2013.01); *G01R 33/02* (2013.01); *H03M 1/08* (2013.01); *H03F 3/04* (2013.01); *H03F 2200/171* (2013.01)

(58) Field of Classification Search
CPC ..... G01R 33/0029; G01R 33/02; H03M 1/08; H03M 1/181; H03M 1/129; H03M 1/1295; H03F 3/04; H03F 2200/171
(Continued)

(56) References Cited

U.S. PATENT DOCUMENTS

| 5,706,003 A | 1/1998 | Kurkoski |
| 6,679,101 B1 * | 1/2004 | Rohner ............... B01D 65/102 |
| | | 200/61.04 |

(Continued)

FOREIGN PATENT DOCUMENTS

| EP | 2522962 A1 | 11/2012 |
| JP | H08321747 A | 12/1996 |
| JP | 2009251690 A | 10/2009 |

OTHER PUBLICATIONS

International Search Report dated Mar. 7, 2018 of the corresponding International Application PCT/EP2017/083098 filed Dec. 15, 2017.

(Continued)

*Primary Examiner* — Giovanni Astacio-Oquendo
(74) *Attorney, Agent, or Firm* — Norton Rose Fulbright US LLP; Gerard Messina (57) ABSTRACT

A magnetometer includes a measurement value transducer that supplies a signal to a first amplifier device; a summation element that reduces an output signal range of an output signal of the first amplifier device; a second amplifier device that amplifies an output signal of the summation element; a low-pass filter filtering an output signal of the second amplifier device; an analog-digital converter converting output of the filter into digital form; and a correction element that divides the digital signal by a correction factor that corresponds to the defined gain factor of the second amplifier device and adds a digital correction signal to the quotient to form a resulting signal, where a scope of the correction signal corresponds to the defined attenuation of the output signal of the first amplifier device.

9 Claims, 4 Drawing Sheets (51) Int. Cl.
*H03M 1/08* (2006.01)
*H03F 3/04* (2006.01)

(58) Field of Classification Search
USPC .................................... 324/226, 225, 200
See application file for complete search history.

(56) References Cited

U.S. PATENT DOCUMENTS

| | | | | |
|---|---|---|---|---|
| 7,365,561 | B2* | 4/2008 | Ito | G01R 1/06761 |
| | | | | 324/754.07 |
| 2001/0031040 | A1* | 10/2001 | Kaine | H04M 3/308 |
| | | | | 379/21 |
| 2009/0273341 | A1 | 11/2009 | Hainz et al. | |
| 2010/0241094 | A1* | 9/2010 | Sherron | A61F 13/42 |
| | | | | 604/361 |
| 2010/0267161 | A1* | 10/2010 | Wu | C12Q 1/001 |
| | | | | 436/149 |
| 2012/0307981 | A1* | 12/2012 | Larkin | H01H 9/0228 |
| | | | | 379/27.01 |

OTHER PUBLICATIONS

Schreier et al., "Understanding Delta-Sigma Data Converters," Wiley Interscience 2005.

* cited by examiner

MAGNETOMETER

CROSS-REFERENCE TO RELATED APPLICATIONS

The present application is the national stage of International Pat. App. No. PCT/EP2017/083098 filed Dec. 15, 2017, and claims priority under 35 U.S.C. § 119 to DE 10 2017 200 143.7, filed in the Federal Republic of Germany on Jan. 9, 2017, the content of each of which are incorporated herein by reference in their entireties.

FIELD OF THE INVENTION

The present invention relates to a magnetometer. The present invention also relates to a method for reading out a magnetometer.

BACKGROUND

In a magnetometer in which a magnetic converter is implemented as a Wheatstone bridge, a typical readout stage includes a front end amplifier, an anti-aliasing filter, an analog-digital converter, and digital filters for the signal processing. Schreier et al., "Understanding Delta-Sigma Data Converters," Wiley Interscience, 2005, discloses basic principles of delta-sigma converters.

SUMMARY

An object of the present invention is to provide a magnetometer that is improved with respect to noise power.

According to a first aspect, this object is achieved by a magnetometer where:

a measurement value transducer supplies a signal to a first amplifier device;

an output signal range of an output signal of a first amplifier device is reduced in a defined manner at the output of a summation element;

an output signal of the summation element is capable of being amplified in a defined manner by a second amplifier device;

an output signal of the second amplifier device is supplied to a low-pass filter;

an output signal of the low-pass filter is supplied to an analog-digital converter;

an output signal of the analog-digital converter is supplied to a correction element; and for the formation of a resulting signal, the output signal of the analog-digital converter is divided by a correction factor that corresponds to the defined gain factor of the second amplifier device, a digital correction signal being added to the resulting quotient, the scope of the correction signal corresponding to the defined attenuation of the output signal of the first amplifier device.

Through the defined attenuation of the input signal, the dynamic range of the input signal is reduced, and it is thereby advantageously made possible to amplify the residual signal to a greater degree. In this way, an influence of noise power of the analog-digital converter on the output signal can advantageously be reduced.

According to a second aspect, the object is achieved by a method for reading out a magnetometer, having the steps of:

supplying an output signal of a measurement value transducer to a first amplifier device;

defined reduction of a range of an output signal of the first amplifier device;

defined amplification of the reduced range of the output signal using a second amplifier device;

removal of high-frequency portions of the amplified attenuated residual signal using a low-pass filter;

conversion of the filter signal using an analog-digital converter; and formation of a resulting signal using a correction element connected after the analog-digital converter, the amplified residual signal being divided by a correction factor that corresponds to the defined gain factor of the second amplifier device, a digital correction value being added to the resulting quotient, the scope of the correction value corresponding to the defined attenuation of the output signal of the first amplifier device.

An advantageous development of the magnetometer is characterized in that the summation element is situated between a first stage of the first amplifier device and a second stage of the first amplifier device. In this way, a partitioning of the amplification effect of the first amplifier device is advantageously achieved.

A further advantageous development of the magnetometer is distinguished in that the summation element is situated after the first amplifier device. In this way, the signal is already completely amplified when it is attenuated in a defined manner by an "artificial offset" impressed from the outside.

A further advantageous development of the magnetometer is distinguished in that the first amplifier device has, in addition to the amplification value one, a further amplification value capable of being parameterized, preferably $2^n$. In this way, two amplification values are provided with which two types of readout steps of the magnetometer can be carried out, a final result being carried out via an adaptation of a result of a specific readout step.

In an example embodiment, the first amplifier device is at least partly functionally integrated into the low-pass filter. In this way, an optimization of the hardware outlay can advantageously be achieved.

In an example embodiment, the output signal range of the output signal of the first amplifier device is reduced in a defined manner by an electrical correction current. In this way, a simple method is provided for attenuating the dynamic range of the input signal so that it can subsequently be amplified to a greater degree.

A further advantageous development of the magnetometer provides that the electrical correction current can be subdivided in accordance with a numerical value of the gain factor, as a function of a level of the output signal of the first amplifier device. In this way, specific design measures are enabled for the defined attenuation of the input signal.

In the following, additional features and advantages of the present invention are described in detail. Identical or functionally identical elements have identical reference characters. For clarity, all of the reference characters may not be entered in all the figures.

Disclosed method features result analogously from corresponding disclosed device features, and vice versa. This means in particular that features, technical advantages, and embodiments relating to the magnetometer result analogously from corresponding embodiments, features, and advantages relating to the method for reading out a magnetometer, and vice versa.

DETAILED DESCRIPTION

Figure 1:
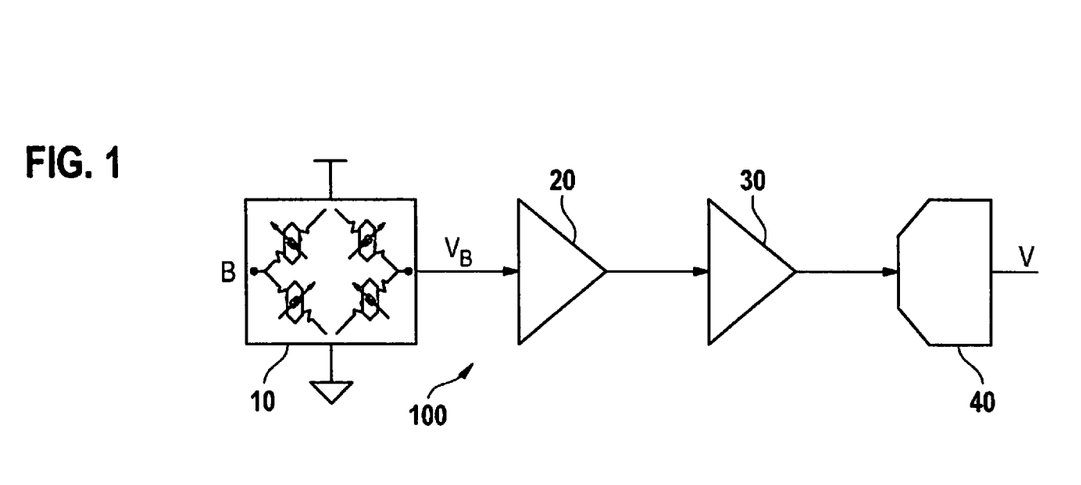
FIG. 1 shows a schematic diagram of a conventional magnetometer.

FIG. 1 is a highly simplified schematic diagram of a conventional magnetometer 100. Visible is a measurement value transducer 10, preferably in the form of a magnetic converter for a geomagnetic signal B, which converts the geomagnetic signal B into an electrical voltage $V_B$. Measurement value transducer 10 is wired in a Wheatstone bridge whose output signal $V_B$ is supplied to a first amplifier device 20, preferably in the form of a front end amplifier. The output of the first amplifier device 20 is connected to an input of a low-pass filter 30 (e.g., an anti-aliasing filter) that filters high-frequency portions out of the input signal. An output of low-pass filter 30 is connected to an input of an analog-digital converter 40 that carries out a conversion to a digital resulting signal V. At the output of analog-digital converter 40, the digital data are outputted with an output data rate ODR that can be adjusted by a user of magnetometer 100.

As a function of requirements relating to noise and power, it can occur that analog-digital converter 40 supplies the largest noise portion in the overall signal, whereas it would however be desirable for the largest noise portion to originate from measurement value transducer 10. This is because the electronics of magnetometer 100 does not significantly reduce a performance level of measurement value transducer 10 that can be achieved corresponding to intrinsic technology limitations.

It is possible to reduce the noise power of analog-digital converter 40 by increasing the supplied electrical power. However, for this purpose electric power has to be doubled in order to achieve a reduction factor of $\sqrt{2}$ in the effective value of the noise power. In the specific case of sigma-delta converters, structural variants relating to a single-bit quantizer architecture can also be taken into account, but as a rule these require a larger outlay for realization.

For measurement value transducer 10, any Wheatstone bridge technology can be used. A version is for example TMR (tunneling magnetoresistance) technology, by which a 1/f noise level is in addition significantly reduced.

A core idea of the present invention is an improvement of the efficiency of a readout stage of magnetometer 100, which is explained in more detail in the following.

Advantageously, a considerable reduction in noise originating from analog-digital converter 40 is realized with a relatively low outlay of chip surface and power, taking advantage of a specific characteristic of the geomagnetic input signal. The geomagnetic input signal of the earth's magnetic field is distinguished in that it has a relatively high constant portion that changes only slowly, and has a relatively low variable portion.

Figure 2:
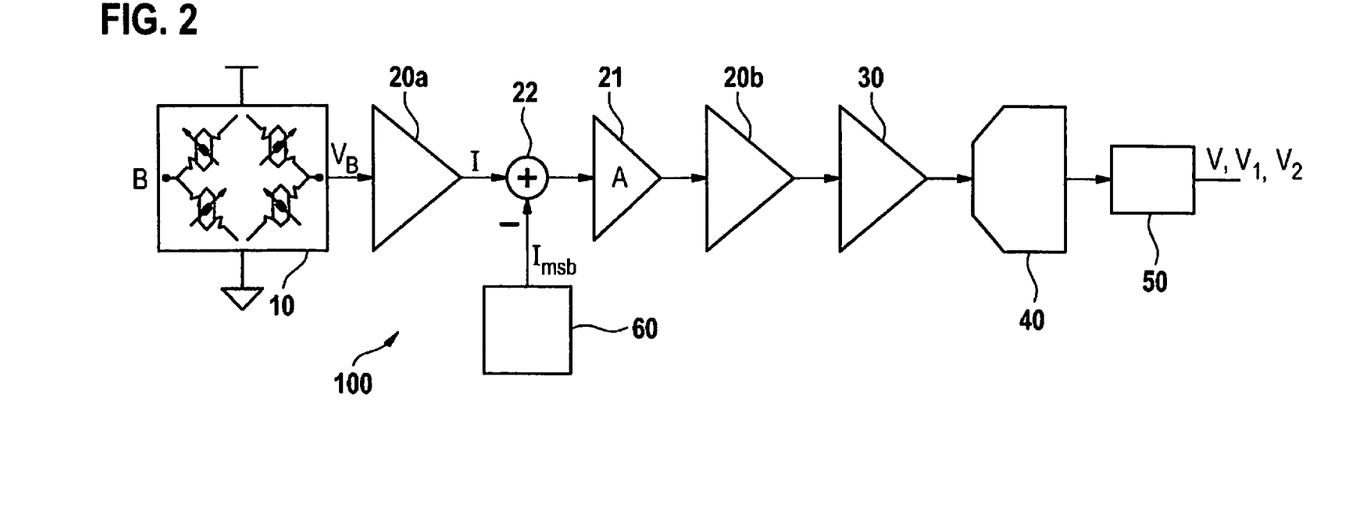
FIG. 2 shows a schematic diagram of a magnetometer according to an example embodiment of the present invention.

FIG. 2 illustrates a magnetometer 100 according to an example embodiment of the present invention. It can be seen that first amplifier device 20 is divided into two stages 20a, 20b, a first stage 20a being realized as a transconductance amplifier and a second stage 20b being realized as a transresistance amplifier.

Between the two stages 20a, 20b, a correction current $I_{msb}$ of a signal source 60 is subtractively supplied to a summation element 22, the correction current $I_{msb}$ representing a defined portion (e.g., 0, ±¼, ±²⁄₄, ±¾) of the complete input signal $I_{FS}$, which corresponds to the full level of the magnetic field $B_{FS}$. $B_{FS}$ is a specific level value of the magnetic input signal B. After summation element 22, the remaining residual signal is amplified, by a second amplifier device 21, by a defined, modifiable (e.g., programmable) gain factor A. Gain factor A can assume, in addition to a nominal value 1, a further defined value, e.g., 4, 8, 16, preferably $2^n$, thus facilitating a reading out of required hardware. Gain factor A represents a physical value in the analog domain, and as a result contains certain statistical fluctuations.

The electrical correction current $I_{msb}$ provided by signal source 60 is dimensioned in such a way that a resulting residual signal ($I-I_{msb}$) can advantageously be highly amplified by second amplifier device 21, thus advantageously significantly reducing a portion of noise power of analog-digital converter 40 in the overall noise power of magnetometer 100. At the output of analog-digital converter 40, using a correction element 50 in the digital domain the portion subtracted at summation element 22 is added again, and in this way resulting signal V of magnetometer 100 is obtained.

As a result, in this way a readout stage for a magnetometer 100 is realized that carries out, in the analog domain, a subtraction of a correction current $I_{msb}$ that is subsequently added again, functionally in the digital domain.

In the following, steps performed for this purpose during a readout cycle of magnetometer 100 are explained in more detail. A reading out of magnetometer 100 is carried out in two functionally different readout steps. In a readout step of type 1, the following operations are carried out:

Readout step type 1: A=1, $I_{msb}$=0, where:

A . . . analog gain factor of first amplifier device 21; and $I_{msb}$ . . . electrical correction current In the readout step of type 1, there takes place a processing of the signal without attenuation by correction current $I_{msb}$. Here, a first output signal $V_1$ is ascertained according to the following mathematical equations:

$$I = V_B/R_1 \quad (1)$$

$$V_1 = R_2 \times I \quad (2)$$

with the parameters:

I . . . electrical input current of summation element 22;

$V_B$ . . . electrical output voltage of measurement value transducer 10;

$R_1$ . . . resistance of transconductance amplifier 20a; and $R_2$ . . . resistance of transresistance amplifier 20b.

Readout step type 2:

$$I_{msb} = k \times I_{FS}/A \quad (3)$$

(e.g., for A=4: $I_{msb}$=k×$I_{FS}$/4), where $I_{FS}$ . . . current corresponding to the full magnetic input signal; and k . . . factor in the range of {0, ±1, ±2, ±3, . . . ±A−1}.

The following are ascertained as the result of the readout step of type 2, in second output signal $V_2$, using the following mathematical equations:

$$I = V_B/R_1 \quad (4)$$

$$V_2 = A \times R_2 \times (I - I_{msb}) \quad (5)$$

It can be seen that in the readout step of type 2, a signal attenuated by electrical correction current $I_{msb}$ is amplified by the second defined value of gain factor A.

With the aid of a final readout step, a specific correction of the result of the readout step of type 2 is carried out using two parameters $A^*$, $V_{msb}^*$, the resultant signal V being ascertained as follows:

$$V = V_2/A^* + V_{msb}^* \qquad (6)$$

with the parameters:

$A^*$ ... digital correction factor during the readout step of type 2; and $V_{msb}^*$ ... digital correction value.

The operations according to equation (6) are carried out by correction element 50 in the digital domain, $A^*$ representing a fixed numerical value that corresponds as closely as possible to the physical value of gain factor A of the analog domain. Preferably, $A^*$ has a numerical value of 4, 8, 16, etc., preferably $2^n$.

Advantageously, in this way a quadratic average value of the noise power generated by analog-digital converter 40 can be reduced by a factor $A^2$ (i.e., in the case of A=4, by a factor of 16). However, to achieve this, the digital correction value $V_{msb}^*$ according to equation (6) is to be provided with adequate precision.

In order to ascertain the digital correction value $V_{msb}^*$, two readout steps are necessary that are carried out in cyclical fashion as close to one another as possible, one readout step of type 1 and one readout step of type 2 being carried out. Here, summations are carried out that are subsequently arithmetically averaged. The named mathematical averaging is expressed in pointed brackets in equation (7) below.

The named averaged calculation of digital correction value $V_{msb}^*$ can be represented mathematically as follows:

$$V_{msb}^* = \langle -V_2/A^* + V_1 \rangle = 1/N \times \sum_{m=-N}^{0} (-V_2^{tm}/A^* + V_1^{tm}) = \qquad (7)$$
$$1/N \times \sum_{m=-N}^{0} (V_1^{tm}(1 - A/A^*) + V_{msb}(A/A^*))$$

with the parameters:

N ... number of samples over which the average value of $V_{msb}^*$ is formed;

$V_2^{tm}$ ... result of readout step of type 2 at time $t_m$;

$V_1^{tm}$ ... result of readout step of type 1 at time $t_m$;

$t_m$ ... time;

m ... index; and $V_{msb}$ ... Analog voltage correction value in correspondence with $I_{msb}$.

The times $t_m$ are distributed uniformly, preferably corresponding to output data rate ODR of analog-digital converter 40, although this is not necessarily required.

In the time average, in this way there results a filtered variable of the digital correction value $V_{msb}$, according to the following equation:

$$V_{msb} = R_2 \times I_{msb} \qquad (8)$$

This type of differential ascertaining of digital correction value $V_{msb}^*$ has the following advantages:

a) Portions of the magnetic signal are present in signals $V_2$ and $V_1$ when they are respectively read out, and, by a subtraction of $V_2$ and $V_1$, the magnetic signal is reduced to the analog correction value $V_{msb}$. In this way, the magnetic portion of the input signal is eliminated, which is also possible due to the small bandwidth of the magnetic portion.

b) Temperature dependencies are completely removed from output signal $V_{msb}$ because the temperature bandwidth is much smaller than the magnetic bandwidth.

c) The input of 1/f noise is partly removed from output signal $V_{msb}$, and this removal is better the closer the succession with which readout steps of type 1 and type 2 follow one another.

d) White noise is partly removed from output signal $V_{msb}$, corresponding to the time duration of the average value formation of $V_{msb}^*$ or of the bandwidth of low-pass filter 30.

It is true that analog correction current $I_{msb}$ can introduce a certain degree of noise, but through a suitable dimensioning it is possible to keep this noise sufficiently smaller than the noise from preceding stages of the readout stage of magnetometer 100.

In the following, on the basis of FIG. 3 an alternative example embodiment of a proposed readout stage for a magnetometer 100 is explained, whose functioning however corresponds in principle to the functioning of the configuration of FIG. 2.

Figure 3:
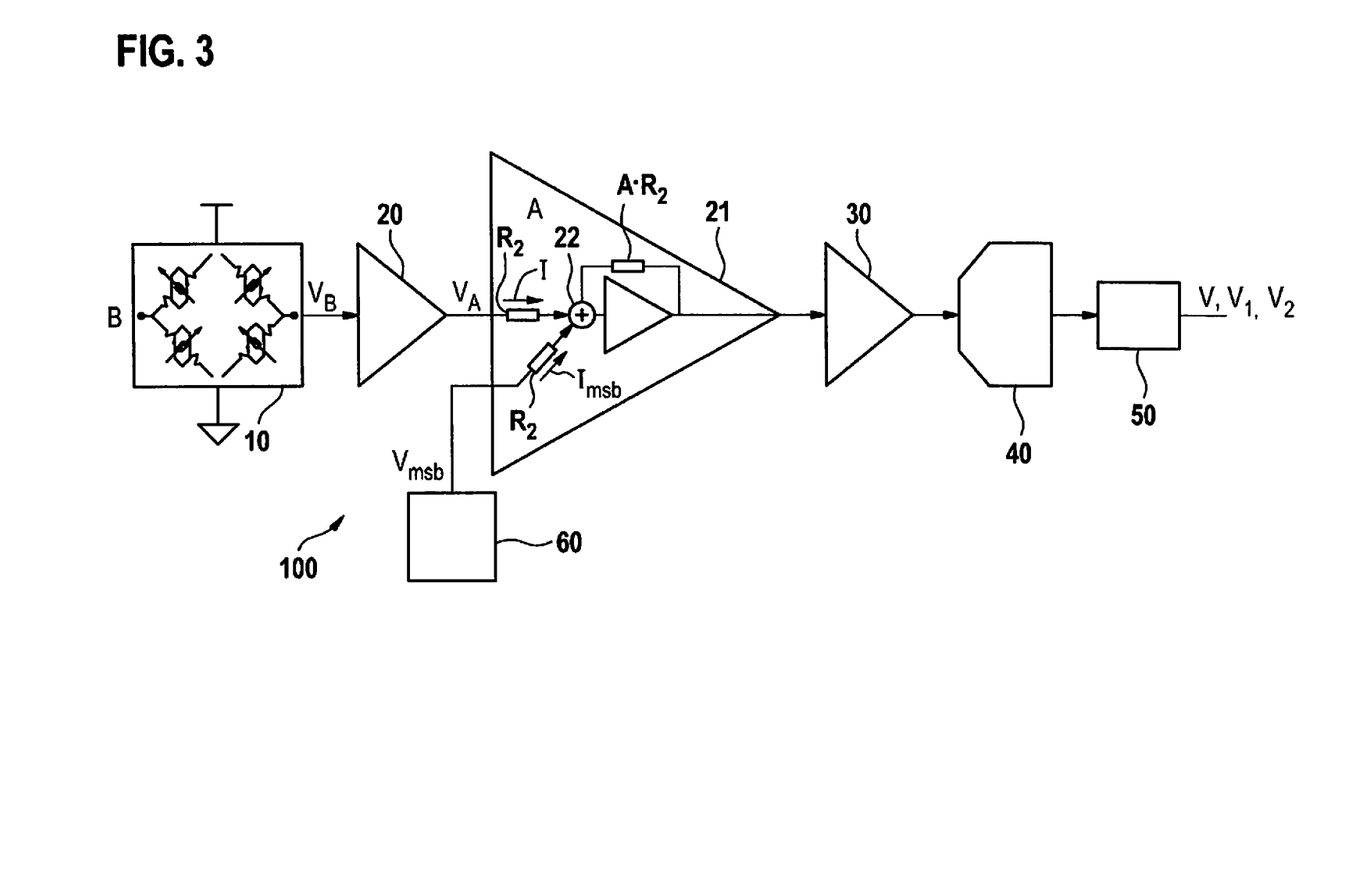
FIG. 3 shows a schematic diagram of a magnetometer according to another example embodiment of the present invention.

FIG. 3 is a schematic diagram of a magnetometer 100, where the impression of the analog correction current $I_{msb}$ at the input of second amplifier device 21 is carried out with the same gain factor A as in the realization of the above-named readout steps of type 1. Inside amplifier element 21, summation element 22 can be seen, to which three resistors $R_2$ of 3 ohms are connected. However, it would also be conceivable to connect resistors having the values $0.5 \times R_2$ or $2 \times R_2$, because due to the proportionality factor this would not change anything about the gain effect of second amplifier device 21. In this case, signal source 60 provides an electrical voltage $V_{msb}$ that drives electrical current $I_{msb}$ into summation element 22. Here the following holds:

$$V_{msb} = R_2 \times I_{msb} \qquad (9)$$

An advantage of this alternative variant of magnetometer 100 is that the complete amplification A has already been carried out before the introduction of noise in connection with the impression of electrical correction current $I_{msb}$, and in this way an influence of noise power of correction current $I_{msb}$ is advantageously reduced.

The named readout steps of type 1 are preferably carried out during approximately 10% of the period of output data rate ODR of analog-digital converter 40, and those of type 2 are preferably carried out during approximately 50% to approximately 60% of the period of the output data rate ODR of analog-digital converter 40. For an example of a period duration of output data rate ODR of 10 ms, this corresponds to carrying out the readout steps of type 1 during approximately 1 ms and carrying out the readout steps of type 2 during approximately 5 ms to approximately 6 ms.

The determination of analog correction current $I_{msb}$ for the defined attenuation of input signal I of summation element 22 is explained in more detail below:

In an initial phase, first output signal $V_1$ is ascertained using a readout step of type 1.

Here, the factor k is determined in such a way that the following condition is met:

$$|V_1 - R_2 \times k \times I_{FS}/4| \text{ or } |V_1 - V_{msb}| = \min \qquad (10)$$

$V_{msb} = k \times I_{FS}/4$ ... analog correction value in the case where A=4.

During regular operation of magnetometer 100, in the readout steps of type 1, values are ascertained for the first output signal V1; here the following holds:

If $|V_1 - R_2 \times k^* \times I_{FS}/4| < \Delta$ then $$k = k^* \qquad (11)$$

where $k^* = k \pm 1$ . . . neighboring values of k; and $\Delta$ . . . defined threshold value of the magnetic input signal.

As a result, in this way a dynamic ascertaining of factor k is carried out. This dynamic ascertaining design is explained in more detail in the following on the basis of FIG. 4.

Figure 4:
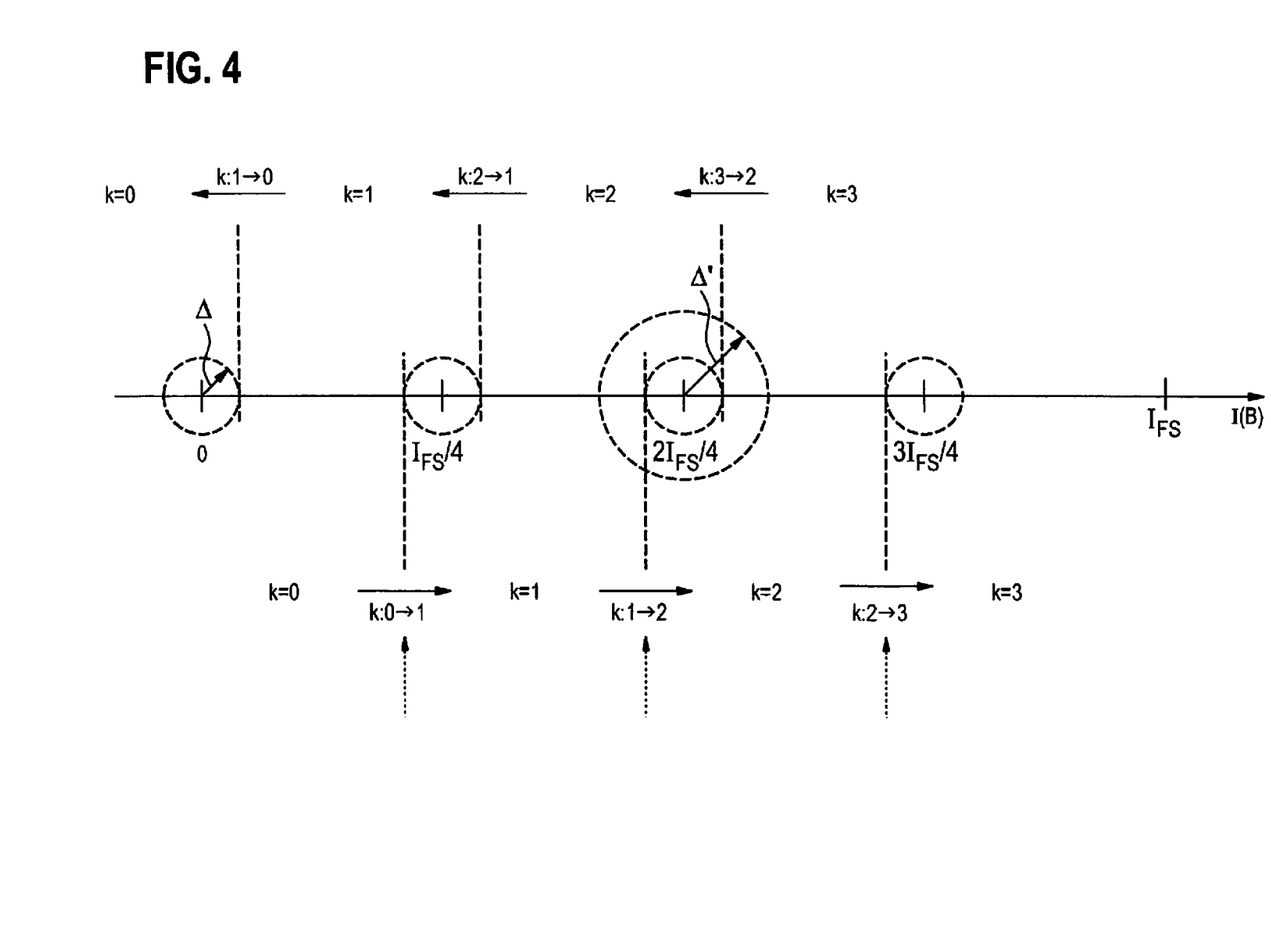
FIG. 4 illustrates a dynamic attenuation of an input signal of the magnetometer according to an example embodiment of the present invention.

On the X axis of FIG. 4, an electrical input current I into summation element 22 is scaled, which current is mapped onto a magnetic input signal of magnetometer 100. This is indicated in the diagram of FIG. 4 by the functional dependence, represented on the X axis, of the electrical input current I on the magnetic flux density B.

It will be seen that the maximum possible level of input current I (designated $I_{FS}$ in FIG. 4) is divided into three subvalues $I_{FS}/4$, $2I_{FS}/4$, $3I_{FS}/4$, corresponding to the numerical values 1, 2, 3 of the factor k.

Circles having a radius $\Delta$ are shown around the named subvalues. When there is a transition of input current I into the interior of a circle, a change of the numerical value of the factor k to a different numerical value is carried out, and in this way the magnitude of the electrical correction current $I_{msb}$ is modified according to the above equation (3).

In a lower part of FIG. 4, an input current I that increases with time is shown, in which a change of the factor k from the value 0 to the value 1 (when the value 2000 μT for the magnetic input signal is exceeded), from value 1 to the value 2 (when the value 4500 μT for the magnetic input signal is exceeded), and from the value 2 to the value 3 (when the value 7000 μT for the magnetic input signal is exceeded), are carried out in temporal succession. The value $I_{FS}$=10000 μT corresponds to the full level of the magnetic input signal, and the defined threshold value $\Delta$ is 500 μT in this example.

In an upper part of FIG. 4, a temporal reduction of input current I is shown, by which the numerical value of the factor k is successively changed from 3, subsequently to 2, and subsequently to 1.

As a result, the correction current $I_{msb}$ is dimensioned corresponding to the respectively valid factor k, and, as a result of this, in the final readout step the digital correction value $V_{msb}^*$ is ascertained in cyclical fashion according to the above equation (7).

Here it can be a problem that at the moment at which a change of the factor k is taking place, an average value formation of the digital correction value $V_{msb}^*$ according to equation (7) provides an incorrect value. This can occur if at this time the digital correction value $V_{msb}^*$ has not yet been averaged over the required numerous readout steps, but rather only a single readout step has been carried out. As a result, in this way an undesirable jump can occur in the bitstream of the output signal V.

To remedy this problem, it can be provided to increase the number of readout steps of type 1 within the period of the output data rate ODR in which the change of the factor k occurs.

As another possibility for remedying this problem, it can be provided to define a second threshold value $\Delta'$. Here, when there is a transition from one value of the factor k to the next value within the second defined threshold value $\Delta'$, it is true that values of output signal V that were ascertained with the factor k are still externally outputted, but internally a calculation of the digital correction value $V_{msb}^*$ with the modified factor k is already taking place. As a result, this brings about a new beginning of average value formations according to the above equation (7) in order to ascertain the digital correction variable $V_{msb}^*$.

As an example, in FIG. 4 a circle is shown having a radius $\Delta'$ of the named increased threshold value around the value of the input current $2I_{FS}/4$. As soon as the magnitude of the input current I, for example coming from the right, is reduced, a change of the factor k from 3 to 2 is caused by this.

However, given a magnitude of input current I within threshold value $\Delta'$ and outside threshold value $\Delta$, output signals V are still ascertained with the factor k=3, whereas for internal purposes readout steps of type 2 are already carried out with the factor k=2, in order in this way to enable an adequate number of average value formations for digital correction value $V_{msb}^*$. An improvement of the digital data of output signal V of magnetometer 100 is advantageously supported in this way.

Mathematically, the second-named approach for the case A=4 can be represented as follows:

$$|V_1 - R_2 \times k^* \times I_{FS}/4| < \Delta' \qquad (12)$$

If the condition of equation (12) is met, the above-mentioned new beginning of the average value formation of digital correction value $V_{msb}^*$ is carried out.

Due to the specific characteristic of the geomagnetic signal, i.e., of the signal of the earth's magnetic field in a typical environment of application (e.g., offset >>50 μT), which includes a low-frequency portion (frequency approximately <50 Hz) having a low amplitude (approximately 50 μT) that is superposed on a large offset portion (frequency approximately <1 Hz) that is temporally nearly constant, the explained dynamic transition in the ascertaining of factor k will rarely occur in practice.

Due to the named specific characteristic of the earth's magnetic field, the proposed magnetometer 100 can be used for example in mobile terminal devices (e.g., mobile telephones) for compass applications.

However, the proposed magnetometer 100 can also be used to measure other input signals that have a similar characteristic, for example for reading out a gas sensor signal for acquiring gas concentrations, gas components, etc.

Figure 5:
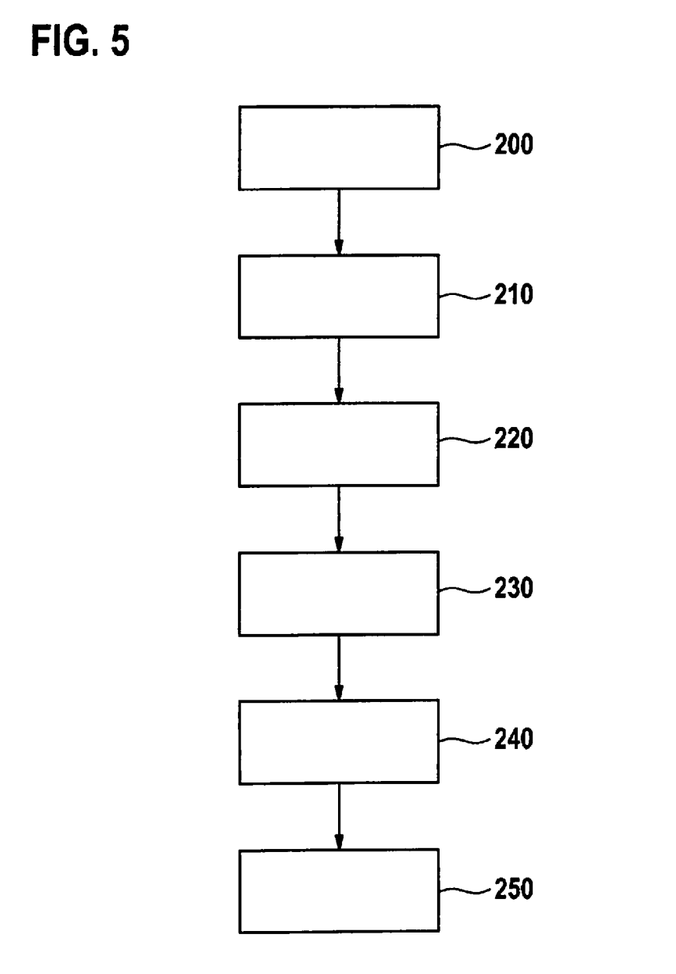
FIG. 5 is a flowchart that illustrates a method for reading out a magnetometer according to an example embodiment of the present invention.

FIG. 5 shows a schematic sequence of a method for reading out a magnetometer 100. In a step 200, an output signal $V_B$ of a measurement value transducer 10 is supplied to a first amplifier device 20. In a step 210, a defined reduction is carried out of a range of an output signal I of first amplifier device 20. In a step 220, a defined amplification of the reduced range of output signal I is carried out by a second amplifier device 21. In a step 230, high-frequency portions of the amplified attenuated residual signal are removed using a low-pass filter 30. In a step 240, a conversion of the filtered signal is carried out using an analog-digital converter 40. In a step 250, a resulting signal V is formed by a correction element 50 connected after analog-digital converter 40, the amplified residual signal being divided by a correction factor A* that corresponds to the defined gain factor A of second amplifier device 21, a digital correction value $V_{msb}^*$ being added to the resulting quotient, the scope of the correction value corresponding to the defined attenuation of the output signal of first amplifier device 20.

Although the present invention has been described above on the basis of specific examples of use, the person skilled in the art will also realize specific embodiments that are not disclosed, or are only partly disclosed, without departing from the core of the present invention.

What is claimed is:

1. A magnetometer, comprising:
 a measurement value transducer;
 a first amplifier;
 a summator;
 a second amplifier;
 an analog-digital converter; and
 a corrector;
 wherein:
  the measurement value transducer is configured to supply a signal to the first amplifier to output a first amplified output signal;
  the summator is configured to reduce an output signal range of the first amplified output signal of the first amplifier in a predefined manner to output a summation output signal;
  the second amplifier is configured to amplify the summation output signal of the summator in a predefined manner to output a second amplified output signal;
  a low-pass filter is configured to output, based on the second amplified output signal, a filtered output signal;
  the analog-digital converter is configured to output a digital signal based on the filtered output signal;
  the corrector is configured to divide the digital signal by a correction factor that corresponds to a predefined gain factor of the second amplifier to obtain a quotient, and add a digital correction signal to the quotient to obtain a resulting magnetometer signal; and
  a scope of the correction signal corresponds to a predefined attenuation of the first amplified output signal.

2. The magnetometer of claim 1, wherein the summator is situated between a first stage of the first amplifier and a second stage of the first amplifier.

3. The magnetometer of claim 1, wherein, with respect to signal flow, the summator is situated after the first amplifier.

4. The magnetometer of claim 1, wherein the first amplifier provides a gain value of one and a further gain value that can be parameterized.

5. The magnetometer of claim 4, wherein the further gain value is $2^n$.

6. The magnetometer of claim 1, wherein the first amplifier is functionally integrated at least partly into the low-pass filter.

7. The magnetometer of claim 1, wherein the magnetometer is configured to reduce the output signal range of the first amplified output signal in a predefined manner by an electrical correction current.

8. The magnetometer of claim 7, wherein the electrical correction current is sub-dividable according to a numerical value of the gain factor, as a function of a level of the first amplified output signal.

9. A method for a magnetometer, the method comprising:
 supplying an output signal of a measurement value transducer to a first amplifier;
 reducing a range of a first amplified output signal output by the first amplifier;
 a second amplifier amplifying the reduced range of the first amplified output signal to produce an amplified attenuated residual signal;
 a low-pass filter removing high-frequency portions of the amplified attenuated residual signal to produce a filtered signal;
 an analog-digital converter converting the filtered signal to a digital signal;
 a corrector dividing the digital signal by a correction factor that corresponds to a predefined gain factor of the second amplifier to obtain a quotient, and adding a digital correction signal to the quotient to obtain a resulting magnetometer signal, wherein a scope of the correction signal corresponds to a predefined attenuation of the first amplified output signal.

* * * * *